(12) United States Patent
Jiang et al.

(10) Patent No.: US 7,408,816 B2
(45) Date of Patent: Aug. 5, 2008

(54) MEMORY VOLTAGE GENERATING CIRCUIT

(75) Inventors: Wu Jiang Jiang, Shenzhen (CN); Yong-Zhao Huang Huang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 29 days.

(21) Appl. No.: 11/440,282

(22) Filed: May 24, 2006

(65) Prior Publication Data

US 2006/0280005 A1    Dec. 14, 2006

(30) Foreign Application Priority Data

Jun. 13, 2005    (CN)    ................. 2005 1 0035331

(51) Int. Cl.
*G11C 5/14* (2006.01)
(52) U.S. Cl. .................. 365/189.09; 365/229
(58) Field of Classification Search .......... 455/73; 323/273, 274; 327/112; 365/273, 189.09, 365/229
See application file for complete search history.

(56) References Cited

U.S. PATENT DOCUMENTS

| | | | | |
|---|---|---|---|---|
| 3,519,946 | A | * | 7/1970 | Camezind .............. 330/299 |
| 3,566,254 | A | * | 2/1971 | Griffin .................. 323/280 |
| 5,335,263 | A | * | 8/1994 | Tsunehiro et al. ......... 455/572 |
| 5,991,833 | A | * | 11/1999 | Wandler et al. ............ 710/52 |
| 6,281,745 | B1 | | 8/2001 | Kim et al. |
| 6,308,278 | B1 | * | 10/2001 | Khouli et al. ............. 713/323 |

OTHER PUBLICATIONS

ON Semiconductor, Linear & Switching Voltage Regulator Handbook, Feb. 2002, ON Semiconducto, HB206/D Rev. 4, Feb. 2002, pp. 13, 14, 17.*
Kevin W. Kobayashi, An InP HBT Common-Base Amplifier with Tunable Transimpedance for 40 GB/S Applications, Aug. 2002, Sirenza Microdevices.*
Peter Hazucha et al., Area-Efficient Linear Regulator With Ultra-Fast Regulation, Apr. 2005, IEEE Jurnal of Solid State Circuits, vol. 40, No. 4.*

* cited by examiner

*Primary Examiner*—Huan Hoang
*Assistant Examiner*—Fernando N Hidalgo
(74) *Attorney, Agent, or Firm*—Morris Manning Martin LLP; Tim Tingkang Xia, Esq.

(57) ABSTRACT

A memory voltage generating circuit includes a first control module, a core circuit, and a second control module. The core circuit includes a regulation amplifier, a first MOSFET, a second MOSFET, and a switch. An output terminal and an inverting input terminal of the regulation amplifier are both connected to an output terminal of the core circuit. A non-inverting input terminal of the regulation amplifier is coupled to the second control module. The non-inverting input terminal of the regulation amplifier is also connected to a referenced voltage via one resistor and is grounded via another resistor. A source of the first MOSFET is coupled to the inverting input terminal of the regulation amplifier. A gate of the first MOSFET is connected to the output terminal of the regulation amplifier. Drains of the first MOSFET and the second MOSFET are coupled to an input voltage via the switch. A source of the second MOSFET is connected to another input voltage. A gate of the second MOSFET is connected to the first control module.

14 Claims, 2 Drawing Sheets

MEMORY VOLTAGE GENERATING CIRCUIT

BACKGROUND

1. Field of the Invention

The present invention relates to a voltage generating circuit for a computer, and more particularly to a memory voltage generating circuit for a computer.

2. General Background

In general, a user can make a computer enter various sleeping modes through a user setting in Advanced Configuration and Power Interface (ACPI), in order to protect the computer and save energy.

Typically, an ACPI has various modes as follows: S0, S1, S2, S3, S4, and S5. While a system is in the S0 state, it is in the system working state. That is, all devices, such as processors, dynamic random access memory (DRAM), power resources and etc., are all maintained. The S0 state is further divided into two sub-states, a before (Advanced Technology Extend Power OK) ATXPOK S0 state and an after ATXPOK S0 state. The conversion of the before and after ATXPOK S0 states is instantaneous. While the system is in the S1 sleeping state, which is also called Power on Suspend (POS), processors of the system are not executing instructions. However, the processor-complex context is maintained. The S2 sleeping state is logically lower than the S1 state. And it is assumed to conserve more power. In the S2 sleeping state, the processors are not executing instructions. Meanwhile, the processor-complex context is not maintained. The S3 state, which is familiar to us, is also called Suspend to RAM (STR). It is logically lower than the S2 state. And it is assumed to conserve more power. In the S3 state, all the devices except DRAM are not maintained. Contents of the DRAM can be maintained by hardware. The S3 state is a commonly used power saving state. Then there is the S4 state, which is also called Suspend to Disk (STD), it is logically lower than the S3 state and is assumed to conserve more power. In the S4 state, a system main power is turned off. A copy of memory is saved to a disk. All the devices stop working while the disk has a power supply. The disk is wakened when needed. The S5 state is in the soft off state and requires a complete boot when awakened. In the S5 state, all the devices including the power supply is turned off.

Functions of the commonly used STR state are to save executing information of the system to a memory. In the STR state, a power supply is needed for main devices such as the memory to insure no loss of important data. However, other devices are turned off to save energy. The system is awakened when a power button is pressed, and a previous working state before STR is resumed by the memory.

A memory voltage generating circuit is needed to output a memory voltage in order to obtain the STR state. The memory voltage is 2.6V.

Referring to FIG. 2, a typical memory voltage generating circuit for a motherboard of the computer includes a control module 10, a first voltage generating circuit 12, and a second voltage generating circuit 14. The control module 10 is used to control working states of the first voltage generating circuit 12 as well as the second voltage generating circuit 14. The memory voltage 2.6V is generated by one of the first and second voltage generating circuits under various working states.

The control module 10 includes a bipolar junction transistor (BJT) Q11' and a BJT Q12'. A base of the BJT Q11' is coupled to a 3.3V standby voltage (3.3V Vsb) via a resistor R5'. An emitter of the BJT Q11' is coupled to a terminal 1' via a resistor R6' for receiving a first voltage control signal (SLP4_L) from a south bridge chip of the computer. A collector of the BJT Q11' is coupled to a 5V standby voltage (5V Vsb) via a resistor R7'. A base of the BJT Q12' is connected to the collector of the BJT Q11'. An emitter of the BJT Q12' is connected to a terminal 2' for receiving a second voltage control signal (ATXPOK) from the motherboard power supply of the computer. A collector of the BJT Q12' is coupled to the 5V Vsb via a resistor R8'. According to power specification of computers, the SLP4_L is a high level voltage when the computer works in the S0, S1, S2, and S3 state. And the SLP4_L is a low level voltage when the computer works either in the S4 or in the S5 state. The ATXPOK is a low level voltage in all the states except the after ATXPOK S0 state. That is, only in the after ATXPOK S0 state the ATXPOK is a high level voltage. In the memory voltage generating circuit, scheduling of working is controlled by voltage control signals of the SLP4_L and ATXPOK.

The first voltage generating circuit 12 includes an integrated circuit (IC) (not shown). The IC outputs a 2.6V standby voltage (2.6V Vsb) as shown in FIG. 2. The first voltage generating circuit 12 further includes a metal-oxide-semiconductor field-effect transistor (MOSFET) Q3'. The MOSFET Q3' is P-channel-strengthen MOSFET. A drain of the MOSFET Q3' is a terminal 3' which outputs the memory voltage 2.6V. The 2.6V Vsb from the IC is input to a source of the MOSFET Q3'. A gate of the MOSFET Q3' is connected to the collector of the BJT Q12'. Then a reference point A' is formed between the control module 10 and the first voltage generating circuit 12.

The second voltage generating circuit 14 includes an operation amplifier U', an N-channel-strengthen MOSFET Q1', an N-channel-strengthen MOSFET Q5', a BJT Q13', and a BJT Q14'. A system voltage 12V Vcc from the motherboard power supply of the computer is provided as a working voltage of the operation amplifier U'. A non-inverting input terminal of the operation amplifier U' is connected to the 2.6V Vsb as a reference voltage via a resistor R1'. An inverting input terminal of the operation amplifier U' is coupled to a source of the MOSFET Q1'. An output terminal of the operation amplifier U' is connected to the source of the MOSFET Q1' via a resistor R2'. A drain of the MOSFET Q1' is coupled to the drain of the MOSFET Q3'. A negative-feedback loop is formed between the operation amplifier U' and the output memory voltage 2.6V via the MOSFET Q1' to ensure a steady output memory voltage 2.6V. A drain of the MOSFET Q5' is coupled to a system voltage 3V Vcc. A gate of the MOSFET Q5' is connected to the output terminal of the operation amplifier U'. A source of the MOSFET Q5' is connected to the source of the MOSFET Q1'. The second voltage generating circuit 14 works when the MOSFET Q1' and the MOSFET Q5' are turned on simultaneously. A base of the BJT Q13' is connected to the reference point A' via a resistor R9'. An emitter of the BJT Q13' is grounded. A collector of the BJT Q13' is coupled to the 5V Vsb via a resistor R10'. A gate of the BJT Q14' is connected to the collector of the BJT Q13'. An emitter of the BJT Q14' is grounded. A collector of the BJT Q14' is connected to a gate of the MOSFET Q1'. The gate of the MOSFET Q1' is coupled to the ground via a resistor R4'. The gate of the MOSFET Q1' is connected to the 12V Vcc via a resistor R3'. The MOSFET Q1' is turned on when the reference point A' is a high level voltage.

The 5V Vsb, 3.3V Vsb, and 2.6V Vsb are high level voltages at any state. The 12V Vcc and 3V Vcc are at high level only when the computer is in after ATXPOK S0 state. The 12V Vcc and 3V Vcc are at high levels on condition that the ATXPOK is a high level voltage.

A working process of the typical memory voltage generating circuit is as follows: the memory voltage is not used in the S1, S2, and S4 states. In the S5 state, the 12V Vcc, 3V Vcc, SLP4_L, and ATXPOK are low level voltages. The BJT Q11' of the control module 10 is turned on. A low level voltage is input to the base of the BJT Q12'. The BJT Q12' is turned off. Therefore, the reference point A' is at a high level. The 5V Vsb is input to the gate of the MOSFET Q3'. Because the MOSFET Q3' is a P-channel-strengthen MOSFET, the MOSFET Q3' is turned off. Therefore, the first voltage generating circuit 12 does not generate the memory voltage 2.6V. As the 12V Vcc and 3V Vcc are at low level, the operation amplifier U' can not get the working voltage, so the low level voltage is input to the gate of the MOSFET Q5'. Because the MOSFET Q5' is an N-channel-strengthen MOSFET, the MOSFET Q5' is turned off. Therefore, the second voltage generating circuit 14 does not work. That is, in the S5 state, there is no need for the memory voltage 2.6V.

In the before ATXPOK S0 state and the S3 state, the ATXPOK, 12V Vcc, and 3V Vcc are at low levels, however, the SLP4_L is a high level voltage, and the voltage of the SLP4_L is higher than 3.3V Vsb when it is in the high level. Therefore, the second voltage generating circuit 14 does not work. The BJT Q11' is turned off. The 5V Vsb is inputted to the base of the BJT Q12'. The BJT Q12' is turned on and the reference point A' is at a low level. Thus, the first voltage generating circuit 12 outputs the memory voltage 2.6V to the terminal 3'.

In the after ATXPOK S0 state, the 12V Vcc, 3V Vcc, SLP4_L, and ATXPOK are all at high levels, and the voltage of the ATXPOK is higher than 5V Vsb. Therefore, the BJT Q11' and BJT Q12' are turned off. Thus, the reference point A' is at a high level. The MOSFET Q3' is turned off. The first voltage generating circuit 12 does not output the memory voltage 2.6V. The BJT Q13' is turned on, and the BJT Q14' is turned off. So the MOSFET Q1' is turned on. Meanwhile, the MOSFET Q5' is turned on because of the high level voltages 12V Vcc and 3V Vcc. So the second voltage generating circuit 14 outputs the memory voltage 2.6V to the terminal 3'.

However, the typical memory voltage generating circuit has some disadvantages. That is, there are so many components in the typical memory voltage generating circuit that connections between them are complex. Thus, cost of the typical memory voltage generating circuit is high.

What is needed is a less complex and less expensive memory voltage generating circuit for a computer.

SUMMARY

A memory voltage generating circuit includes a first control module, a core circuit, and a second control module. The core circuit includes a regulation amplifier, a first MOSFET, a second MOSFET, and a switch. An output terminal of the regulation amplifier is connected to an output terminal of the core circuit through a resistor, and an inverting input terminal of the regulation amplifier is also connected to the output terminal of the core circuit. A non-inverting input terminal of the regulation amplifier is coupled to the second control module. The non-inverting input terminal of the regulation amplifier is also connected to a reference voltage via one resistor and is grounded via another resistor. A source of the first MOSFET is coupled to the inverting input terminal of the regulation amplifier. A gate of the first MOSFET is connected to the output terminal of the regulation amplifier. Drains of the first MOSFET and the second MOSFET are coupled to a first input voltage via the switch. A source of the second MOSFET is connected to a second input voltage. A gate of the second MOSFET is connected to the first control module.

Because of canceling components of the IC and some control elements, cost of a memory voltage generating circuit is reduced and connections between components are simpler.

Other advantages and novel features will become more apparent from the following detailed description when taken in conjunction with the accompanying drawings, in which:

DETAILED DESCRIPTION OF THE EMBODIMENT

Figure 1:
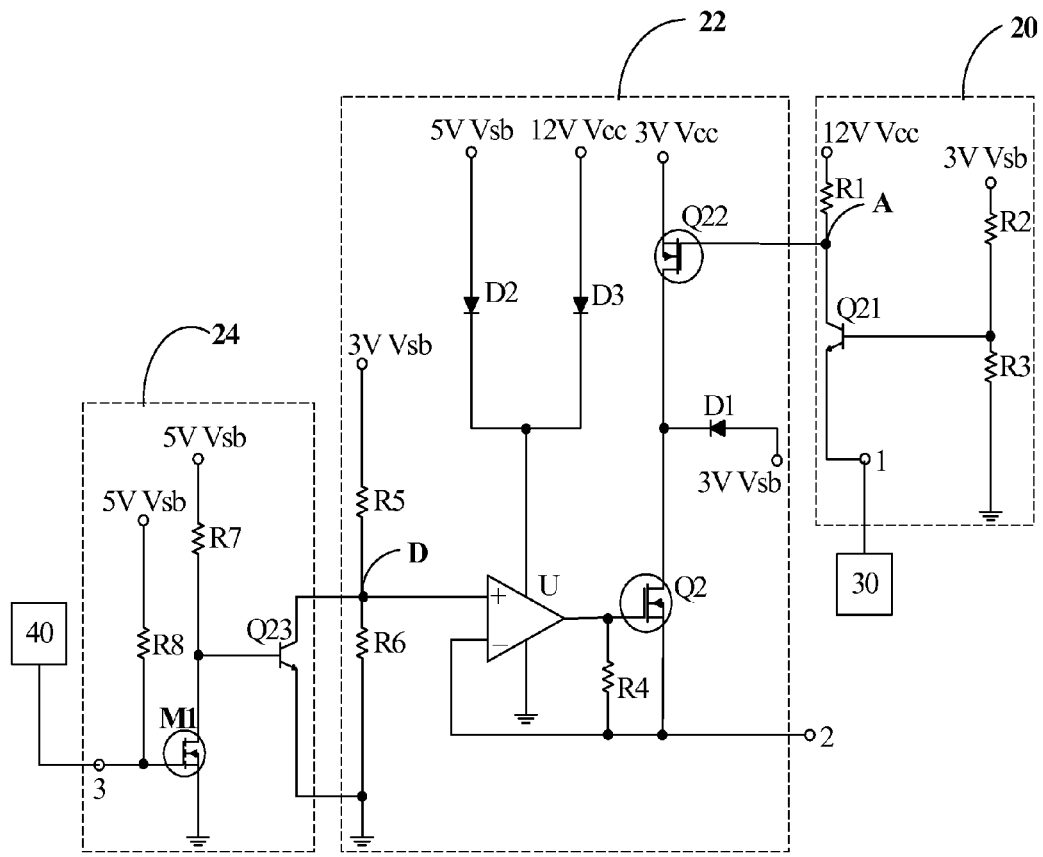
FIG. 1 is a circuit diagram of a memory voltage generating circuit in accordance with a preferred embodiment of the present invention.
Figure 2:
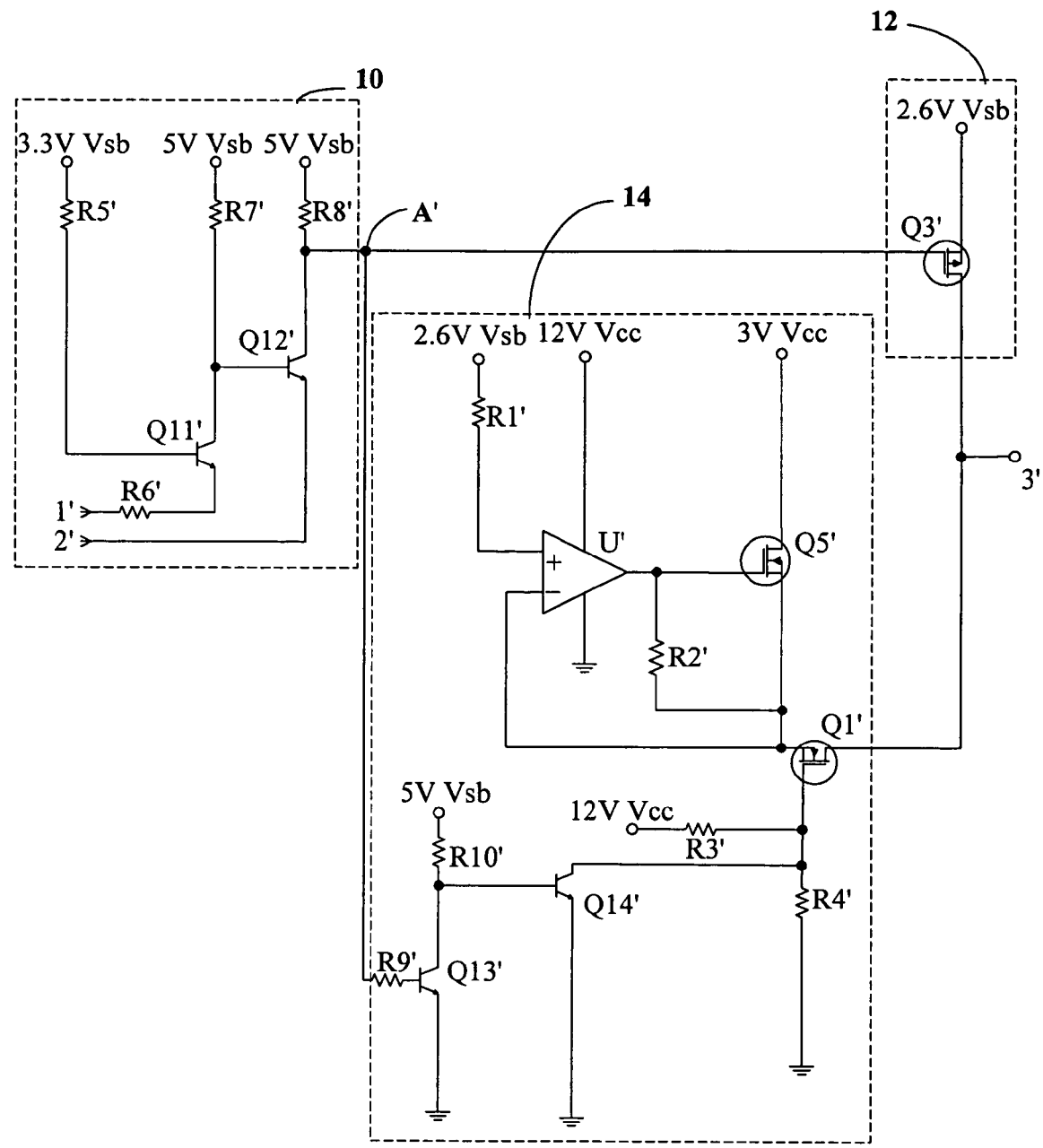
FIG. 2 is a circuit diagram of a typical memory voltage generating circuit.

Referring to FIG. 1, a memory voltage generating circuit of a preferred embodiment of the present invention for an electronic device like a computer is shown. The memory voltage generating circuit comprises a first control module 20, a core circuit 22, and a second control module 24.

The first control module 20 comprises a bipolar junction transistor (BJT) Q21. A collector of the BJT Q21 is coupled to a 12V Vcc via a resistor R1. A base of the BJT Q21 is coupled to a 3V Vsb via a resistor R2, and is grounded via a resistor R3. An emitter of the BJT Q21 is connected to a terminal 1 for receiving a first voltage control signal (ATXPOK) from a motherboard power supply 30 of a computer. The ATXPOK is a low level voltage in all states except the after ATXPOK S0 state.

The core circuit 22 comprises a regulator like a regulation amplifier U, a MOSFET Q2, a MOSFET Q22, and a plurality of switches. The MOSFET Q2 and the MOSFET Q22 are N-channel-strengthen MOSFETS. The switches of the core circuit 22 comprise a first diode D1, a second diode D2, and a third diode D3. A source of the MOSFET Q2 is connected to a terminal 2 that is an output terminal of the memory voltage generating circuit. The needed memory voltage is 2.6V. A gate of the MOSFET Q2 is coupled to an output terminal of the regulation amplifier U. A node between a drain of the MOSFET Q2 and a drain of the MOSFET Q22 is connected to a cathode of the diode D1. An anode of the diode D1 is coupled to the 3V Vsb. A source of the MOSFET Q22 is coupled to a 3V Vcc. A gate of the MOSFET Q22 is coupled to the collector of the BJT Q21. A reference point A is formed to control states of the MOSFET Q22. That is, the first control module 20 determines working states of the MOSFET Q22. A working voltage of the regulation amplifier U is provided either by a 5V Vsb via the diode D2 or by the 12V Vcc via the diode D3. That is, the working voltage of the regulation amplifier U is provided by the 5V Vsb when the 12V Vcc is at a low level. However, in the after ATXPOK S0 state, the 12V Vcc is at a high level, the diode D2 is turned off. Thus, the working voltage of the regulation amplifier U is provided by the 12V Vcc. The output terminal of the regulation amplifier U is coupled to the terminal 2 via a compensation resistor R4, an inverting input terminal of the regulation amplifier U is connected to the terminal 2 to form a negative-feedback loop for a steady output. The 3V Vsb is grounded via a resistor R5 and a resistor R6. A reference point D is formed between the resistors R5 and R6. A non-inverting input terminal of the regulation amplifier U is connected to the reference point D.

The second control module 24 comprises a BJT Q23 and a MOSFET M1. The MOSFET M1 is an N-channel-strengthen MOSFET. An emitter of the BJT Q23 is grounded. A collector of the BJT Q23 is coupled to the non-inverting input terminal of the regulation amplifier U via the reference point D. A gate of the MOSFET M1 is coupled to a terminal 3 for receiving a second voltage control signal (SLP4_L) from a south bridge chip 40 of the computer. The gate of the MOSFET M1 is also connected to the 5V Vsb via a resistor R8. A source of the MOSFET M1 is grounded. A drain of the MOSSFET M1 is connected to the 5V Vsb via a resistor R7. A base of the BJT Q23 is connected to a node between the resistor R7 and the drain of the MOSFET M1. According to a power specification of the computer, the SLP4_L is a high level voltage when the computer works in the S0, S1, S2, and S3 states. And the SLP4_L is a low level voltage when the computer works either in the S4 or in the S5 state. In the memory voltage generating circuit, a scheduling of the working states is controlled by voltage control signals of the SLP4_L and ATXPOK.

A working principle of the memory voltage generating circuit is as follows: the memory voltage 2.6V is provided by a system voltage or a standby voltage. It is required that the memory voltage 2.6V is provided by the system voltage when the computer is in the after ATXPOK S0 state which is also called normal state. While, the memory voltage 2.6V is provided by the standby voltage when the computer is in the S3 state.

A working process of the memory voltage generating circuit is as follows: as known, the 5V Vsb and 3V Vsb are high level voltages at any states. The 12V Vcc and 3V Vcc are high level voltages only when the computer is in the after ATXPOK S0 state. The 12V Vcc and 3V Vcc are at high levels on condition that the ATXPOK is a high level voltage.

In the S5 state, the 12V Vcc, 3V Vcc, SLP4_L, and ATXPOK are low level voltages. Therefore, the BJT Q21 is turned on. The reference point A is at a low level. The MOSFET M1 is turned off. Thus, the BJT Q23 is turned on, and the reference point D is at a low level. Therefore, a low level voltage is input to both the gate of the MOSFET Q22 and the gate of the MOSFET Q2. Because the MOSFET Q22 and the MOSFET Q2 are N-channel-strengthen MOSFETS, both the MOSFET Q22 and the MOSFET Q2 are turned off. That is, in the S5 state, there is no output for the memory voltage 2.6V.

In the before ATXPOK S0 state and the S3 state, the ATXPOK, 12V Vcc, and 3V Vcc are low level voltages. Therefore, the reference point A is at a low level. The MOSFET Q22 is turned off. However, the SLP4_L is a high level voltage. Thus, the MOSFET M1 is turned on. The BJT Q23 is turned off. The reference point D is at a high level. A high level voltage is input to the gate of the MOSFET Q2. Thus, the MOSFET Q2 is turned on. The memory voltage 2.6V is provided by the 3V Vsb.

In the after ATXPOK S0 state, the 12V Vcc, 3V Vcc, SLP4_L, and ATXPOK are all high level voltages. Therefore, the reference point A is at a high level. The MOSFET Q22 is turned on. The MOSFET M1 is turned on. The BJT Q23 is turned off. The reference point D is at a high level. A high level voltage is input to the gate of the MOSFET Q2. Thus, the MOSFET Q2 is turned on. The 3V Vsb is shielded by the 3V Vcc via the MOSFET Q22. And the memory voltage 2.6V is provided by the 3V Vcc.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A memory voltage generating circuit, comprising:
   a core circuit outputting a voltage for a memory, the core circuit comprising:
   a regulation amplifier, a non-inverting input terminal of the regulation amplifier receiving a first standby voltage, an inverting input terminal of the regulation amplifier connected to an output terminal of the memory voltage generating circuit forming a negative-feedback loop, an output terminal of the regulation amplifier connected to the output terminal of the memory voltage generating circuit through a resistor;
   a first metal-oxide-semiconductor field-effect transistor (MOSFET), a gate of the first MOSFET connected to the output terminal of the regulation amplifier, a source of the first MOSFET connected to the inverting input terminal of the regulation amplifier, a drain of the first MOSFET receiving the first standby voltage via a switch; and
   a second MOSFET, a source of the second MOSFET receiving a first system voltage, a drain of the second MOSFET connected to the drain of the first MOSFET;
   a first control module connected to a gate of the second MOSFET for controlling working states of the second MOSFET, the first control module comprising a first transistor, an emitter of the first transistor receiving a first voltage control signal, a base of the first transistor being connected to the first standby voltage, a collector of the first transistor being connected to the gate of the second MOSFET and receiving a second system voltage as well; and
   a second control module connected to the non-inverting input terminal of the regulation amplifier for controlling working states of the regulation amplifier, the second control module comprising a second transistor and a third MOSFET, a base of the second transistor receiving a second standby voltage, a collector of the second transistor connected to the non-inverting input terminal of the regulation amplifier, a drain of the third MOSFET connected to the base of the second transistor, a gate of the third MOSFET receiving a second voltage control signal.

2. The memory voltage generating circuit as claimed in claim 1, wherein the first MOSFET, the second MOSFET, and the third MOSFET are N-channel MOSFETS.

3. The memory voltage generating circuit as claimed in claim 2, wherein the first voltage control signal is from a south bridge chip of a computer.

4. The memory voltage generating circuit as claimed in claim 2, wherein the second voltage control signal is from a motherboard power supply of a computer.

5. The memory voltage generating circuit as claimed in claim 1, wherein the first transistor and the second transistor are Bipolar Junction Transistors (BJTs).

6. A memory voltage generating circuit for supplying an electrical source to a memory of a computer, the memory voltage generating circuit comprising:
   a core circuit electrically connectable to a first standby voltage and a first system voltage, and capable of switching to electrically connect to a selective one of said first standby voltage and first system voltage so as to supply said selective one of said first standby voltage and first system voltage to a memory electrically connectable with said core circuit;

a first control module electrically connectable between said core circuit and a first voltage control signal, and a second control module electrically connectable between said core circuit and a second voltage control signal, said first control module and said second control module controllably providing said first voltage control signal and said second voltage control signal to said core circuit based on different states of the computer so as to control said core circuit in provisioning of said selective one said first standby voltage and said first system voltage to said memory.

7. The memory voltage generating circuit as claimed in claim 6, wherein said core circuit comprises a regulation amplifier and a first N-channel metal-oxide-semiconductor field-effect transistor (MOSFET) electrically connectable between said second control module and said first standby voltage, and a second N-channel MOSFET electrically connectable between said first control module and said first system voltage.

8. The memory voltage generating circuit as claimed in claim 7, wherein the first control module comprises a first transistor electrically connectable between said first voltage control signal and said second N-channel MOSFET.

9. The memory voltage generating circuit as claimed in claim 8, wherein the second control module comprises a third N-channel MOSFET and a second transistor electrically connectable between said second voltage control signal and said regulation amplifier.

10. The memory voltage generating circuit as claimed in claim 9, wherein the first voltage control signal is from a south bridge chip of a computer.

11. The memory voltage generating circuit as claimed in claim 9, wherein the second voltage control signal is from a motherboard power supply of a computer.

12. The memory voltage generating circuit as claimed in claim 9, wherein the first transistor and the second transistor are Bipolar Junction Transistors (BJTs).

13. A circuit assembly comprising:
a memory of a computing system;
a first power source providing a first preset power voltage for said memory to work when said computing system is in a normal work status, said first power source serially electrically connectable with said memory via a first switch;
a second power source providing a second preset power voltage for said memory to work when said computing system is in a standby status, said second power source serially electrically connectable between said memory and said first power source via a second switch;
a first control module electrically connectable with said first switch, and used to accept a first voltage control signal from said computing system to identify said normal work status of said computing system, said first control module transmitting said first voltage control signal to said first switch to enable switching of said first switch in response to said first voltage control signal and accordingly releasing said first power voltage to said memory for work; and
a second control module electrically connectable with said second switch, and used to accept a second voltage control signal from said computing system to identify said standby status of said computing system, said second control module transmitting said second voltage control signal to said second switch to enable switching of said second switch in response to said second voltage control signal and accordingly releasing said second power voltage to said memory for work.

14. The circuit assembly as claimed in claim 13, wherein a regulator is electrically connectable between said second control module and said second switch to regulate said first and second power voltages released to said memory respectively.

* * * * *